United States Patent [19]

Elliott et al.

[11] Patent Number: 4,904,337
[45] Date of Patent: Feb. 27, 1990

[54] PHOTO-ENHANCED PYROLYTIC MOCVD GROWTH OF GROUP II-VI MATERIALS

[75] Inventors: James Elliott, Allston; William E. Hoke, Wayland; Vilnis G. Kreismanis, Belmont, all of Mass.

[73] Assignee: Raytheon Company, Lexington, Mass.

[21] Appl. No.: 202,645

[22] Filed: Jun. 6, 1988

[51] Int. Cl.$^4$ .................................. C30B 25/10
[52] U.S. Cl. ..................... 156/610; 156/613; 156/614; 156/DIG. 72; 156/DIG. 82; 156/DIG. 92; 156/DIG. 102
[58] Field of Search ....... 156/610, 613, 614, DIG. 72, 156/DIG. 82, DIG. 92, DIG. 102; 148/DIG. 64, DIG. 110

[56] References Cited

U.S. PATENT DOCUMENTS

| | | | |
|---|---|---|---|
| 3,642,529 | 2/1972 | Lee et al. | 156/613 |
| 4,066,481 | 1/1978 | Manasevit et al. | 156/613 |
| 4,115,163 | 9/1978 | Gorina et al. | 156/610 |
| 4,422,888 | 12/1983 | Stutius | 156/613 |
| 4,509,997 | 4/1985 | Cockayne et al. | 156/613 |
| 4,524,090 | 6/1985 | Bottka et al. | 156/613 |
| 4,568,397 | 2/1986 | Hoke et al. | 156/DIG. 82 |
| 4,648,917 | 3/1987 | Kay et al. | 156/613 |
| 4,650,539 | 3/1987 | Irvine et al. | 156/DIG. 82 |
| 4,670,063 | 6/1987 | Schachameyer et al. | 427/53.1 |
| 4,719,124 | 1/1988 | Lu et al. | 156/613 |
| 4,784,963 | 11/1988 | Krimmel et al. | 427/53.1 |

OTHER PUBLICATIONS

"Metalorganic Growth of CdTe and HgCdTe Epitaxial Films at a Reduced Substrate Temperature using Diisopropyltelluride" by W. E. Hoke et al., Appl. Phys. Lett. 46 (4), Feb. 15, 1985, pp. 398–400.

"Low—Temperature Metalorganic Growth of CdTe and HgTe Films using Ditertiarybutyltelluride" by W. E. Hoke et al., Appl. Phys. Lett, 48 (24), Jun. 16, 1986, pp. 1669–1671.

"Growth of High Mobility N—Type CdTe by Photoassisted Molecular Beam Epitaxy" by R. N. Bicknell et al., Appl. Phys. Lett. 49 (17), Oct. 27, 1986, pp. 1095–1097.

"Metalorganic Growth of HgTe and CdTe at Low Temperatures using Diallyltelluride" by R. Korenstein et al., J. Appl. Phys. 62 (12), Dec. 15, 1987, pp. 4929–4931.

"The Free Radical Mechanism for Photo—Epitaxy" by S. J. C. Irvine et al., Jounral of Crystal Growth 79, (1986), pp. 371–377.

"P—Type CdTe Epilayers Grown by Photoassisted Molecular Beam Epitaxy" by R. N. Bicknell, Appl. Phys. Lett. 49 (25), Dec. 22, 1986, pp. 1735–1737.

Primary Examiner—John Doll
Assistant Examiner—Robert M. Kunemund
Attorney, Agent, or Firm—Denis G. Maloney; Richard M. Sharkansky

[57] ABSTRACT

A photo-enhanced pyrolytic technique for growing Group II-VI materials is described. Reactant vapors preferably low stability reactant vapors which form Group II-VI materials at relatively low temperatures are introduced into a reactor vessel. Disposed in the reactor vessel is a substrate which is heated to a growth temperature of generally less than about 400° C. The surface of the substrate is illuminated by ultraviolet radiation and during pyrolytic decomposition of the vapors introduced to the growth vessel, the surface kinetic energy of migrating species on the surface of the substrate is increased by the radiation resulting in a reduction in defect levels in the material grown over the substrate.

4 Claims, 2 Drawing Sheets

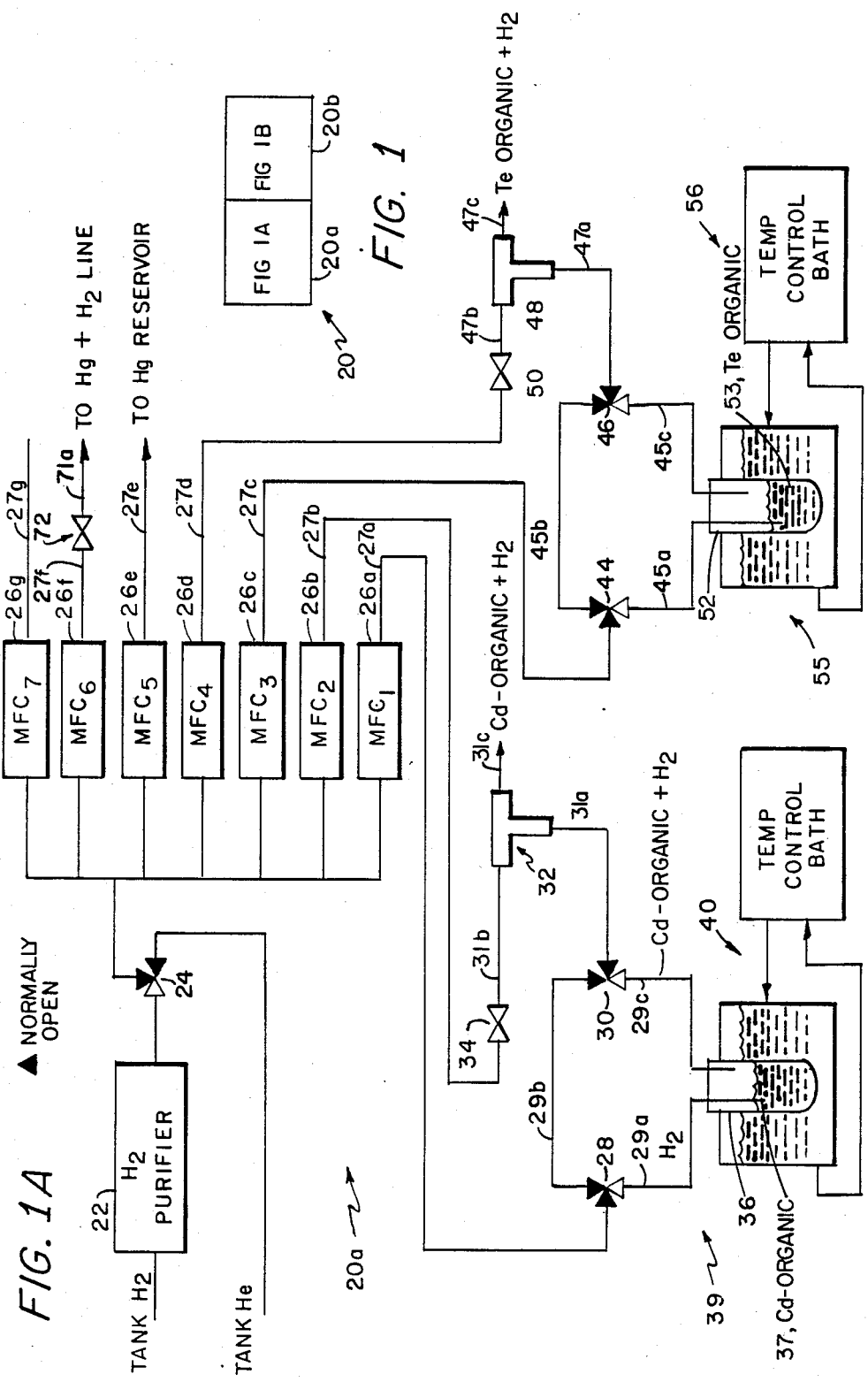

PHOTO-ENHANCED PYROLYTIC MOCVD GROWTH OF GROUP II-VI MATERIALS

BACKGROUND OF THE INVENTION

This invention relates generally to epitaxial growth techniques and more particularly to growth of Group II-VI semiconductor crystalline materials.

As is known in the art, Group II-VI semiconductor epitaxial materials such as cadmium telluride and mercury cadmium telluride have important applications as photodetector elements for detection of electromagnetic energy in the spectral range from approximately 0.8 microns to 30 microns. That is, by adjusting an alloy composition of cadmium and mercury, photodetector elements may be provided which are sensitive to different wavelengths within the 0.8 micrometers to 30 micrometer wavelength band.

Several techniques have been suggested for providing cadmium telluride and mercury cadmium telluride suitable for use in photodector applications. One technique is so-called metalorganic photolytic decomposition as described in an article entitled "Free Radical Mechanism for Photo-Epitaxy" by Irvine et al., Journal of Crystal Growth 79(1986), pp. 371-377, in which metalorganic reactants are introduced into a reactor vessel and the metalorganics are illuminated with high powered radiation to photolytically break bonds in the metalorganics and deposit the material. This technique is generally referred to as a photolytic technique since the initial reactions involved in the process (i.e. the reaction which cracks the metalorganics) are photolytically driven. The subsequent reactions are pyrolytic in which the free radical produced by cracking the metalorganic is combined with free hydrogen and evolved. Several problems are associated with this technique. The region of epitaxial growth on the substrate occurs within a very narrow area defined by the focused width of the illuminating source which is quite small compared to practical substrate diameters. Outside the epitaxial growth region, a homogeneous nucleation layer is provided which is unsuitable for semiconductors applications. Considering the growth region observed, reported growth rates of 0.4 μm/h to 0.8 μm/h are relatively low. The low growth rates would negate some of the advantages achieved by low temperature decomposition using the photolytic technique. In papers entitled "Growth of High Mobility N-Type CdTe by Photo-Assisted Molecular Beam Epitaxy" by Bicknell et al., Applied Physic Letters 49(17), October 1986, pp. 1095-1097 and P-Type CdTe Epilayers Grown by Photo-assisted Molecular Beam Epitaxy, Bicknell et al., Applied Physic Letters 49(25), December 1986, pp. 1735-1737, the authors describe a process of dopant activation on a CdTe grown layer by using an argon laser to activate dopant species at the surface of a CdTe substrate during molecular beam epitaxial growth.

A second technique suggested is metalorganic vapor phase epitaxy (MOVPE), also referred to as metalorganic chemical vapor deposition (MOCVD). As it is known, the MOCVD technique for growing mercury cadmium telluride involves directing vapors comprising mercury, dimethylcadmium, and diethyltelluride into a reactor vessel and chemically reacting directed vapors to epitaxially deposit the Group II-VI material. This technique in which a primary alkyl of the Group VI element here tellurium is directed into the reactor vessel allows for growth of Group II-VI materials at temperatures above about 400° C.

It is also known in the art, as set forth in a paper entitled "Low Temperature Metalorganic Growth of CdTe and HgCdTe Films using Ditertiarybutyltelluride" by W. E. Hoke et al, Applied Physics Letters 48, No. 24, June 16, 1986 and as set forth in a paper entitled "Metalorganic Growth of CdTe and HgCdTe Epitaxial Films at a Reduced Substrate Temperature using Diisopropyltelluride" by W. E. Hoke et al, Applied Physics Letters 46, No. 4, Feb. 15, 1985, that MOCVD growth of Group II-VI materials such as mercury cadmium telluride is possible at temperatures lower than 400° C. Low temperature growth of Group II-VI materials is very desirable for several reasons. Low temperature growth enables the minimization of homojunction or heterojunction interdiffusion, reduces the mercury vacancy concentration, reduces foreign substrate out diffusion into the epitaxial layers, and permits the growth of ultra thin epitaxial structures. In addition to the advantages of low temperature MOCVD growth, one particular advantage with this technique is that relatively high growth rates typically 1.6 μm/h at 230° C. and 25.5 μm/h at 320° C. are provided over practical sized substrate areas.

We have found, however, that low temperature growth provides a separate set of problems which are not generally present in films grown by the MOCVD technique at temperatures of about 400° C. and above. With CdTe films grown at temperatures below 400° C. particularly those grown at temperatures less than about 360° C., the crystalline quality (i.e. the defect state concentration) of the epitaxial films degrades significantly from theoretical values with decreasing growth temperature. Consequently, the transport properties of epitaxial HgCdTe films will also appear to degrade with increasing cadmium telluride mole fraction and reduced growth temperature. For example, with $Hg_{1-x}Cd_xTe$ material where x is equal to 0.3 indicating a higher concentration of cadmium telluride, the actual charge transport is expected to be lower than the theoretical charge transport for x=0.3 material.

Accordingly, it is desired to provide techniques of metalorganic chemical vapor deposition of Group II-VI materials at low temperatures to maintain the benefits of low temperature metalorganic chemical vapor deposition while reducing the problems encountered with respect to the crystalline quality.

SUMMARY OF THE INVENTION

In accordance with the present invention, a method of providing a layer comprising Group II-VI material having an improved crystallographic quality is described. The technique involves the steps of directing a flow of a Group II organic towards the substrate, said substrate being disposed at a temperature of less than about 400° C. and directing a flow of the Group VI organic towards the substrate. The directed flow of Group II and Group VI organics pyrolyically decompose generally in the region over the substrate at temperatures less than about 400° C. while the substrate is being illuminated with a source of radiation of sufficient intensity to increase the surface kinetic energy of species formed on the surface of the substrate enabling said species to surmount any defect potential minima in the crystal structure of the material and thus be incorporated at the proper lattice positions in the crystal. Accordingly, sufficient kinetic energy is provided to the species as a result of the pyrolytic reactions of the organics and photolytic enhancement of the kinetic energy of the species resulting in the diffusing atoms to find an absolute potential energy minima. The intensity of the radiation source illuminating the substrate is substantially less than that required to photolytically break bonds on the organics directed towards the substrate. With this decomposition of the Group II-VI vapor flows, the kinetic energy of migrating species resulting from the pyrolytic decomposition is increased, enabling the Group II and Group VI species to be incorporated in the proper lattice positions in the crystal structure, thus providing high quality crystalline films of Group II-VI materials.

In the example of the cadmium telluride and mercury cadmium telluride materials, four ionic bonds are formed in the cadmium telluride or mercury cadmium telluride zinc blende crystal structure. Incorporation of species at proper lattice positions, results in an absolute potential energy minima for the migrating surface species. However, in the zinc blende structure for cadmium telluride or mercury cadmium telluride, there are other, less stable, potential energy minima. For example, a cadmium atom may incorporate on a tellurium lattice position or an interstitial position forming a defect state. When a defect state is formed in the crystal, it can increase the carrier concentration in the crystal or reduce the carrier mobility, thereby reducing the crystalline quality of the epitaxial layer. Accordingly, crystalline quality is degraded when the migrating species after pyrolytic decomposition do not have sufficient kinetic energy to overcome or surmount the defect potential minima associated with formation of the epitaxial Group II-VI layer. This problem becomes increasingly important as the growth temperature provided over the substrate is reduced. By illuminating the substrate with a source of radiation, the surface kinetic energy of the species is increased enabling the species to overcome any intermittant potential energy minima and incorporate at the proper lattice position for the specie, resulting in a structure having an absolute potential energy minima for the migrating surface specie. This provides Group II-VI material having high crystal quality, lower defect concentration and enhanced mercury vacancy concentration control. This enables these features to be present in films grown by lower temperature MOCVD techniques, thereby permitting the films to have minimal heterojunction, homojunction interdiffusions, reduced mercury vacancy concentrations to near background donor dopant levels, and reduced foreign substrate out-diffusion while enabling for the growth of ultra-thin epitaxial structures.

In accordance with a further aspect of the present invention, the Group VI organic has at least one organic group selected from the group consisting of a secondary alkyl, a tertiary alkyl, an allyl, a benzyl, and a cycloallyl group bonded directly to the Group VI element. With this particular arrangement, destabilization of the Group VI element permits the low temperature growth of Group II-VI materials, and by illuminating the substrate during growth of Group II-VI materials, Group II-VI layers are provided having improved crystal properties.

BRIEF DESCRIPTION OF THE DRAWINGS

The foregoing features of this invention, as well as the invention itself, may be fully understood from the following detailed description of the drawings, in which:

FIG. 1 is a view showing relationships between FIGS. 1A and 1B; and

FIGS. 1A and 1B are schematic diagrams of a growth apparatus for growing Group II-VI materials in accordance with the present invention.

DESCRIPTION OF THE PREFERRED EMBODIMENTS

Figure 1B:
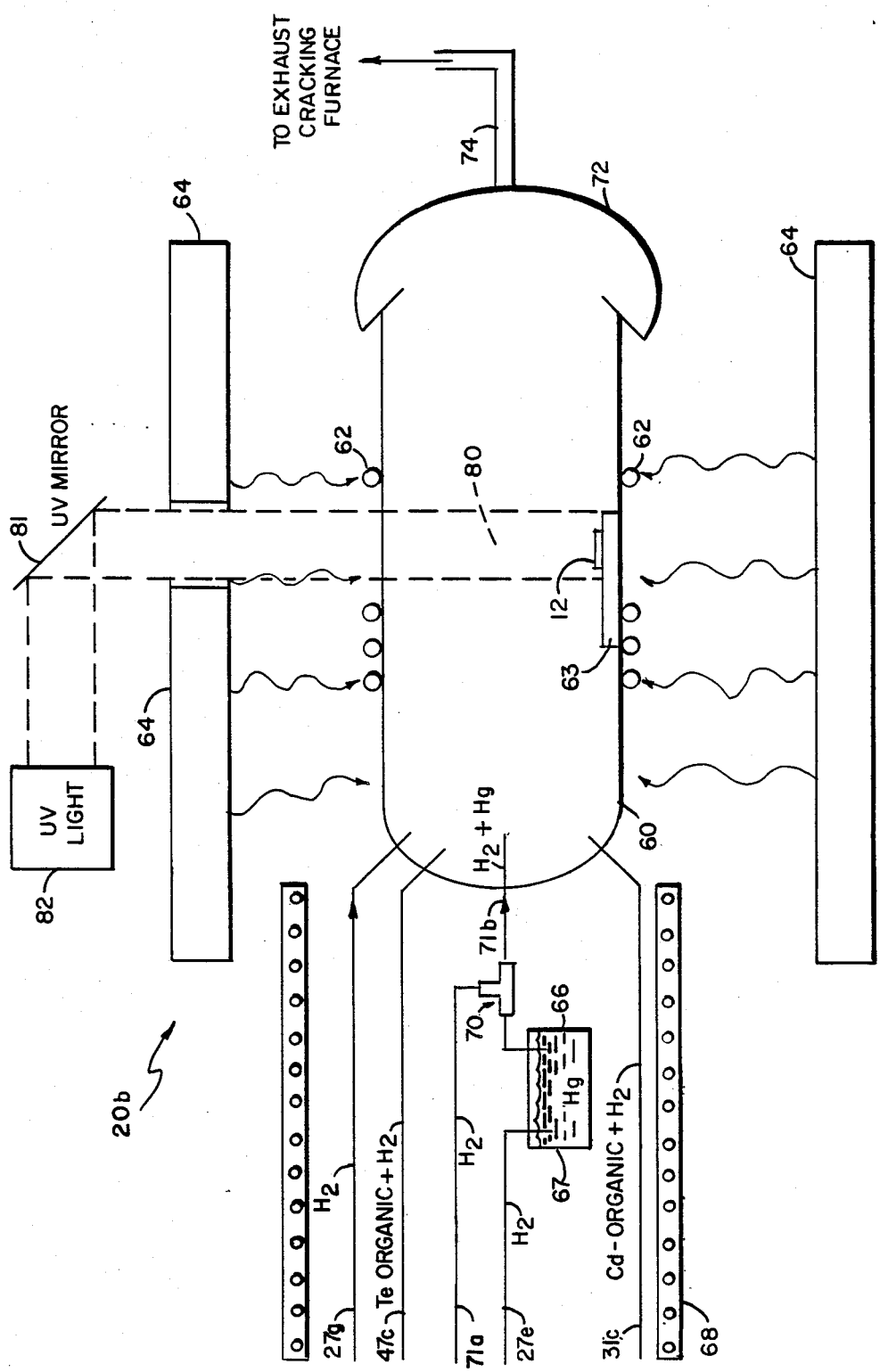

Growth of Group II-VI materials such as cadmium telluride (CdTe) or mercury cadmium telluride (HgCdTe) over a substrate 12 (FIG. 1B) comprised of a Group II-VI material, a Group III-V material, or sapphire will now be described in conjunction with FIGS. 1A and 1B.

Referring to (FIG. 1), a schematic representation of a vapor phase epitaxial apparatus 20 includes a vapor apparatus 20a (FIG. 1A) having a manifold 26, mass flow controllers 26a-26g, and a bubbler apparatus 39 and 55, as shown. During operation, hydrogen is fed via H2 purifier 22 and valve 24 to manifold 26. The vapor phase apparatus also includes a vapor phase epitaxial reactor 20b (FIG. 1B), here including an open quartz reactor tube 60, as shown. Suffice here to say that the graphite susceptor 63 disposed in the quartz reactor tube 60 is inductively heated by a r.f. coil 62, disposed around the quartz reactor tube 60, is activated to raise the temperature of a susceptor 63, a substrate 12 disposed on the susceptor 63, and the immediate regions around the substrate 12 to a predetermined temperature. The temperature of the susceptor is monitored, via a thermal couple (not shown) embedded in the susceptor 63. The substrate 12 is here illuminated by a source 82 of light, as shown.

Prior to the susceptor 63 and the substrate 12 being heated, however, the system is purged of atmospheric gases by introducing helium, then hydrogen into the interior of the furnace tube 60 and the vapor apparatus 20a. Then, vapors from lines 27e, 27g, 31c and 47c are fed into the tube where they react to provide the epitaxial layers. Quartz reaction tube 60 also includes a cap 72 at an opposite end from lines 27e-27g, 31c and 47c. Cap 72 is coupled to a quartz exhaust line 74 which is used to exhaust gases from tube 60 and deliver such gases to a cracking furnace (not shown).

Referring now particularly to FIG. 1A, the vapor apparatus 20a provides tubes 31c, 47c, 71a and 27e, 27g which feed vapors to the quartz reaction tube 60 (FIG. 3B), as shown.

Tube 31c, the Cd-organic+H2 tube is fed from a junction member 32. Junction member 32 is used to mix flows from two gas sources delivered to a pair of ports thereof, and direct said mixed gas flow to a third port thereof which is coupled to the quartz tube 31c. The first port of junction 32 is fed from the bubbler apparatus 39. Bubbler apparatus 39 includes a pair of solenoid control valves 28, 30. A first one of said solenoid control valves, here solenoid control valve 28, has a first port coupled to a first mass flow controller 26a, via tube 27a, and has a second port coupled to a bubbler 36, via tube 29a. Bubbler 36 here has disposed therein the dimethylcadmium (DMCd) 37. The bubbler 36 is provided in a recirculating temperature control bath 40 which provides a constant flow of a coolant liquid around the bubbler 36 to maintain the cadmium organic 37 contained in bubbler 36 at a predetermined temperature. A second tube 29c is disposed in bubbler 36, but above the surface of the dimethylcadmium liquid and is coupled to a port of solenoid control valve 30. A third tube 29b is coupled between remaining ports of solenoid control valves 28 and 30. The normally deactivated state of solenoid control valves 28 and 30 enables hydrogen gas to pass from the hydrogen source, here the mass flow controller 26a via tube 27a to tube 29b, and on through tube 31c to purge the reactor vessel of atmosphere gases as described above. During epitaxial growth of cadmium telluride or mercury cadmium telluride over substrate 12, valves 28 and 30 are placed in their activated state enabling hydrogen gas to pass through tube 29a into bubbler 36 which contains the cadmium organic liquid 37. The hydrogen gas bubbles through the cadmium organic liquid 37 and picks up molecules of cadmium organic 37. Therefore, a mixture of cadmium organic and hydrogen (DMCD+$H_2$) emerges from bubbler 36 via line 29c and is routed by solenoid control valve 30 to line 31a. A second mass flow controller 26b is activated to provide a predetermined flow of carrier gas, here hydrogen, through a valve 34 and via line 31b to junction member 32. Therefore, emerging from line 31c is a diluted vapor flow of the cadmium organic and the carrier gas, here hydrogen.

Tube 47c, the Te-organic+$H_2$ tube is fed from a junction member 48. Junction member 48 is used to mix flows from two gas sources and deliver said mixed gas flow to a third port coupled to tube 47c. The first port of junction 48 is fed from the bubbler apparatus 55. Bubbler apparatus 55 includes a pair of solenoid control valves 44, 46. A first one of said solenoid control valves, here solenoid control valve 44, has a first port coupled to a third mass flow controller 26c via tube 27c, and has a second port coupled to a bubbler 52 via tube 45a. Bubbler 52 here has disposed therein the telluride organic 53. The bubbler 52 is provided in recirculating temperature control bath 56 which provides a constant flow of a coolant liquid around the bubbler 52 to maintain the liquid 53 of bubbler 52 at a predetermined temperature. A second tube 45c is disposed in bubbler 52, but above the surface of the Te-organic liquid 53 and is coupled to a port of solenoid control valve 46. A third tube 45b is coupled between remaining ports of solenoid control valves 44 and 46. The normally deactivated state of solenoid control valves 44 and 46 enables hydrogen gas to pass from the hydrogen source, here the mass flow controller 26c via tube 27c to tube 45b, and on through tube 47c to purge the reactor vessel of atmosphere gases as described above. During epitaxial growth of cadmium telluride or mercury cadmium telluride over the substrate, valves 44 and 46 are placed in their activated state enabling hydrogen gas to pass through tube 45a into bubbler 52. The hydrogen gas bubbles through the Te-organic liquid 53 and picks up molecules of the liquid 53. Therefore, a mixture of Te organic and hydrogen (DIPTe+$H_2$) merges from bubbler 53 via line 45c and is routed by solenoid control valve 46 to line 47a. A fourth mass flow controller 26d is activated to provide a predetermined flow of carrier gas, here hydrogen, through a valve 50 and via line 47b to junction member 48. Therefore, emerging from line 47c is a diluted vapor flow of the Te organics with respect to the concentration of the carrier gas, here hydrogen.

Tube 27e is fed from a fifth mass flow controller 26e to a quartz reservoir 66 (FIG. 1B) containing liquid mercury. Hydrogen gas is directed over the surface of the liquid mercury, and vapor molecules of mercury over the liquid mercury surfaces are picked up by the hydrogen gas flow providing a vapor flow of mercury and hydrogen. The vapor flow is fed to a quartz junction element 70 (FIG. 3B). A second input port of quartz junction element 70 is fed via a quartz tube 71a which is coupled to a sixth mass flow controller 26f, via a valve 72 and tube 27f. Emerging from junction element 70 via tube 71b and into tube 60 is, therefore, a diluted flow of mercury vapor and hydrogen. One technique or process for operating the apparatus as generally shown in FIGS. 1A and 1B is described in copending application Ser. No. 918,697 filed Oct. 16, 1986 which is a continuation of Ser. No. 838,192 filed Mar. 7, 1986, now abandoned, which is a continuation of Ser. No. 749,851 filed June 28, 1985 by W. E. Hoke et al., now abandoned, and as mentioned in copending application Ser. No. 029,379 filed Mar. 23, 1987 which is a continuation of Ser. No. 844,489 filed Mar. 26, 1986, which is a continuation-in-part of Ser. No. 749,851, filed June 28, 1985 by W. E. Hoke et al., and copending application Ser. No. 876,608 filed June 20, 1986 by W. E. Hoke et al., all of which are assigned to the assignee of the present invention.

As also mentioned in these applications, higher growth rates at lower growth temperatures of Group II–VI materials may be obtained using an organic source of the Group VI element having the chemical structure set forth:

$$R_1-X-R_2$$

where X is the Group VI atom and $R_1$, $R_2$ may or may not be the same and at least one of $R_1$, $R_2$ is selected from the group consisting of a secondary alkyl, a tertiary alkyl, an allyl, a benzyl, or a cycloallyl group bonded directly to the Group VI atom.

Referring in particular now to FIG. 1B, a Group II vapor flow from tube 31c, a second Group II vapor flow from line 71b, and a Group VI vapor flow from line 47c are directed into the quartz reactor vessel 60. Therefore, the vapor flow comprising the Group II organic source, the Group VI organic source and mercury are directed towards the substrate 12 which is disposed at a predetermined elevated temperature determined at least with respect to the desired growth rate and the stability of the Group VI organic used. Disposed over substrate 12 is an ultra-violet (UV) radiation source 82 and mirror 81 which direct a beam of here non-coherent, ultraviolet radiation 80 through the quartz tube 60 towards the surface of the substrate 12. Here the radiation source 82 of said light is near ultraviolet radiation but may also be visible radiation or near infrared radiation. The energy of the light is insufficient to break the bonds of the Group II–VI species in the vapor stream directed towards the substrate but is sufficient to provide a sufficient increase in the kinetic energy of the migrating species after pyrolytic decomposition of the Group II metalorganic and the Group VI organic to permit the migrating species of Group II and Group VI atoms to incorporate at the proper lattice positions for the Group II–VI crystal structure.

The quartz reservoir 66 containing the liquid elemental mercury and the region adjacent thereof is resistively heated by a resistance heat source 68, as shown, to a temperature of at least 175° C., but generally less than 240° C. as is well known. The zone immediately after the reservoir 66 and past the substrate 12 is then heated by banks of infrared lamps 64 to a temperature in the range of 175° C. to 240° C. as is also well known. Heating of the walls prevents premature condensation of mercury from the vapor stream.

In operation, the susceptor 63 is inductively heated by the r.f. coil 62, the reservoir 66 by the resistive heating element 68, and reaction tube 60 by the infrared lamps 64. Each is then allowed to reach the growth temperatures. When the apparatus 20b has reached the growth temperatures, valves 28, 30, 34, 44, 46, 50 and 72 are activated enabling diluted mixtures of hydrogen gas+cadmium organic, hydrogen gas+telluride organic, and hydrogen gas+mercury to emerge from tubes 31c and 47c and 71b, respectively, upstream from the substrate 12. The hydrogen and metalorganic vapors are at the desired operating temperature provided by the uniform heating of the substrate and the region around the substrate.

For example, in growing cadmium telluride or mercury cadmium telluride, the cadmium metalorganic may comprise dimethylcadmium, mercury is provided in an elemental form in reservoir 67 and the tellurium metalorganic may comprise a tellurium compound having an activation energy for formation of a free radical which is lower than the activation energy for diethyltelluride. Such compounds include di-isopropyltelluride, ditertiarybutyltelluride, dibenzyltelluride, di-(2-propen-1-yl)telluride, and di-(2-cyclopropen-1-yl) telluride, as well as the nonsymmetrical counterparts thereof. By non-symetric compounds are meant those having two different groups bonded to the Group VI atom that is having one of the aforementioned secondary and tertiary alkyls, allyls, benzyls, and cycloallyl groups bonded to the Group VI atoms and with hydrogen or another organic group such as a methyl group, for example, providing the second group bonded to the Group VI atom. Generally, the substrate is heated to a temperature in the range of about 180° C. to generally less than 400° C. Higher substrate temperatures may be used but in general the problem of insufficient kinetic energy to surmount intermediate potential energy minima is less of a concern above about 400° C.

In particular, as the growth temperature is reduced, the available kinetic energy to the migrating species after pyrolytic decomposition is also correspondingly reduced. It is believed that the lower kinetic energy provided to the species permits some of the species to incorporate at improper lattice sites in the crystal structure of cadmium telluride and mercury cadmium telluride.

A simplified potential energy arguement may be used to explain the theory behind this photo-enhanced, pyrolytic technique. At the surface of substrate 12 during growth of the Group II–VI materials, pyrolyzed fragments of the organics such as tellurium and cadmium atoms and organic radicals are present. These fragments, as well as mercury atoms, migrate along the substrate surface. For high crystal quality, the cadmium, tellurium, and mercury must incorporate at proper lattice sites during growth of the crystal.

The mercury cadmium telluride zinc blend structure has four ionic bonds. Incorporation of the cadmium, tellurium, and mercury species at the proper lattice sites results in a crystal structure having absolute potential energy minimum for each of the migrating surface species. However, there are other less stable potential energy minima. For example, a cadmium atom may incorporate on a tellurium lattice site or interstitial position and in each instance form a defect state. Since the interatomic bonding for this case is weaker in the defect state, the potential energy of this configuration is not as stable as for proper incorporation. Accordingly, material quality is degraded when the migrating species do not have enough kinetic energy to surmount the defect potential minima and incorporate at the proper lattice sites in absolute potential energy minima. This problem becomes increasingly evident as the substrate temperature is reduced, particularly from about 360° C. towards 180° C. and below. The binding energy of a defect state is considerably less than that of a normal lattice position. The binding energy is thought to be of the order of 1 eV compared to more than 5 eV for a strongly bonded lattice atom. Accordingly, radiation with energies between about 1 eV to 5 eV (wavelengths between 1200 nm to 250 nm) possess sufficient energy to prevent or break defect state bonding. This radiation is not sufficient, however, to break proper lattice interatomic bonds or to crack the metalorganics.

Suitable radiation intensity for illumination of the substrate is in the range of about less than about 0.1 W/cm$^2$ up to about 1 W/cm$^2$, over the wavelength range of about 263 nm to 1200 nm. These intensities are suitable in the above mentioned wavelength range when the reactor tube 60 is comprised of natural quartz. When synthetic quartz is used, however, the synthetic quartz has transmission in the near down to about 200 nm and thus the intensity range may be different.

This technique is a photolytic enhancement of a pyrolytic decomposition of the organics. Illumination of the substrate does not change in any significant manner the growth rate of the material. The growth rate of the Group II–VI materials is determined only by the pyrolytic processees involved during growth of the layers.

It is further believed that the photo-enhanced pyrolytic MOCVD offers several advantages in comparison to straight forward photolytic MOCVD. Since the photo-enchanced, pyrolytic MOCVD is not used to break bonds between the metalorganic constituents, longer wavelength radiation sources can be used in the photo-enhanced process. This characteristic has the practical effect of permitting a wider choice of light sources. Furthermore, lower radiation intensities when compared to the intensities used during photolytic decomposition may be used with the photo-enhanced technique, since the concentration of defect states is generally several orders of magnitude less than the atomic concentration. Consequently, the growth rate for defect formation is considerably smaller than the film growth rate itself. Thus, since the photo-enhanced intensity is only dependent upon defect growth rate, the intensity of the radiation required is lower than the photolytic technique in which the photolytic intensity must be dependent upon the film growth rate. Because of two preceding advantages, it may be easier to achieve photo-enhanced radiation intensity levels which are in excess of that required to minimize the defect state concentrations. Variations in intensity accordingly would not affect crystal quality since the radiation intensity would be in excess of that required to minimize the defect state concentration. The above advantages also make possible illumination of large area substrate areas with the photo-enhanced approach, without cadmium tellurium dust formation which is a problem in the photo-assisted techniques. Further, higher growth rates are provided with low temperature photo-enchanced pyrolytic MOCVD growth compared to the photolytic or photoassisted approaches.

Having described preferred embodiments in the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. A method of providing layer comprising mercury cadmium telluride, over a substrate comprises the steps of:

directing a flow of cadmium organic towards the substrate, said substrate being disposed at an elevated temperature of less than about 400° C.;

directing mercury towards said substrate;

directing a flow comprising a tellurium organic towards towards the substrate, said tellurium organic having at least one organic group selected from the group consisting of a secondary alkyl, a tertiary alkyl, an allyl, a benzyl, or a cycloallyl group bonded directly to the tellurium atom; and pyrolyzing said flows by thermally decomposing the organics at the substrate to form the mercury cadmium telluride layer on the substrate while illuminating the substrate with a source of radiation having an intensity in the range of 0.1 w/cm$^2$ to 1 w/cm$^2$ over a wavelength range of about 250 nm to 1200 nm to increase the surface energy of cadmium, mercury, and tellurium from the pyrolyzed flows as the layer of mercury cadmium telluride is formed.

2. The method of claim 1 wherein said substrates is at a temperature less than 320° C.

3. The method of claim 2 wherein said tellurium organic is selected from the group consisting of diisopropyltelluride, ditertiarybutyltelluride, dibenzyltelluride, di(2-propen-1-yl)telluride, di(2-cyclopropen-1-yl)telluride, and nonsymmetric compounds thereof.

4. The method of claim 3 wherein the cadmium organic is dimethylcadmium.

* * * * *